US005206546A

United States Patent [19]

Usami

[11] Patent Number: 5,206,546
[45] Date of Patent: Apr. 27, 1993

[54] LOGIC CIRCUIT INCLUDING VARIABLE IMPEDANCE MEANS

[75] Inventor: Mitsuo Usami, Akishima, Japan

[73] Assignee: Hitachi, Ltd., Tokyo, Japan

[21] Appl. No.: 739,195

[22] Filed: Aug. 1, 1991

Related U.S. Application Data

[63] Continuation-in-part of Ser. No. 669,642, Mar. 14, 1991.

[30] Foreign Application Priority Data

Mar. 16, 1990 [JP] Japan ................................. 2-66069
Aug. 18, 1990 [JP] Japan ................................. 2-217640

[51] Int. Cl.[5] .............................................. H03K 19/01
[52] U.S. Cl. .................................... 307/446; 307/443; 307/451
[58] Field of Search ............... 307/443, 446, 451, 454, 307/455–456, 246, 570

[56] References Cited

U.S. PATENT DOCUMENTS

| 4,698,525 | 10/1987 | Tauana et al. | 307/456 |
|---|---|---|---|
| 4,713,561 | 12/1987 | Yamada | 307/456 |
| 4,746,817 | 5/1988 | Banker et al. | 307/446 |
| 4,791,320 | 12/1988 | Kawata et al. | 307/446 |
| 4,855,622 | 8/1989 | Johnson | 307/456 |
| 4,999,520 | 3/1991 | Usami et al. | 307/456 |
| 4,999,523 | 3/1991 | Chan et al. | 307/570 |
| 5,003,199 | 3/1991 | Chuang et al. | 307/446 |
| 5,006,731 | 4/1991 | Denda | 307/455 |
| 5,059,836 | 10/1991 | Lee et al. | 307/570 |

Primary Examiner—David Hudspeth
Attorney, Agent, or Firm—Antonelli, Terry, Stout & Kraus

[57] ABSTRACT

A SPL (or Super Push-pull Logic) circuit is provided which includes: a first variable resistor circuit connected between the collector of an input transistor and a first supply voltage terminal (GND) a second variable resistor circuit connected between the emitter of the input transistor and a second supply voltage terminal ($V_{EE}$) and a push-pull output circuit. The second variable resistor circuit includes an N-channel MOSFET which has its gate electrode made receptive of any of the output signals of the SPL circuit, a differentiated signal of the output signal, and an inverted signal of the input signal.

32 Claims, 4 Drawing Sheets

LOGIC CIRCUIT INCLUDING VARIABLE IMPEDANCE MEANS

This application is a continuation-in-part application of Ser. No. 669,642 filed on Mar. 14, 1991, to M. Usami, entitled "LOGIC CIRCUIT AND SEMICONDUCTOR INTEGRATED CIRCUIT DEVICE", the disclosure of which is incorporated by reference.

BACKGROUND OF THE INVENTION

The present invention relates to a logic circuit and, more particularly, to technology which is effective especially when applied to the so-called "SPL (as abbreviated from Super Push-pull Logic) circuit" to be packaged in a high speed logic integrated circuit device constituting a high speed computer.

A known type of circuit, referred to as an NTL (as abbreviated from Non-Threshold Logic) circuit, includes a phase division circuit (a phase splitter circuit) made responsive to an input signal and an output emitter follower circuit for transmitting the inverted output signal of the phase division circuit.

We developed the so-called "SPL (abbreviated from Super Push-pull Logic) circuit", as an NTL circuit which had its output unit replaced by an active pull-down circuit. This was filed as the patent application bearing Ser. No. 07/330,461 on Mar. 30, 1989 (now U.S. Pat. No. 4,999,520).

This previously developed SPL circuit is equipped, as exemplified in FIG. 9, with a phase division circuit which includes: an input transistor (a phase splitter transistor) T1 made receptive of an input signal SI; and a collector resistor R5 and an emitter resistor R4 connected, respectively, between the ground potential of the circuit and the collector of the input transistor T1 and between the emitter of the input transistor T1 and the supply voltage of the circuit. The inverter output signal of the phase division circuit, i.e., the collector potential of the input transistor T1, is fed to the base of an output transistor T3. The non-inverted output signal of the phase division circuit, i.e., the emitter potential of the input transistor T1, is fed to the base of a pull-down transistor T4 through a differentiation circuit composed of a capacitor C1 and a resistor R1. This pull-down transistor T4 has its base coupled to receive a predetermined bias voltage VB which is established immediately before the bias circuit is turned on. This bias voltage can be provided via the bias transistor T2. Thus, the pull-down transistor T4 acts as an active load for the output transistor T3 an constitutes an active pull-down circuit together with the capacitor C1 and the resistor R1. As a result, the SPL circuit has its sensitivity enhanced and its operations speeded up.

Prior to the present invention, we have developed the SPL circuit which is improved, as shown in FIG. 7, over the aforementioned SPL circuit of FIG. 9. Specifically in FIG. 7, the SPL circuit includes: a P-channel MOSFET Q1 connected between the ground potential of the circuit and the collector of the input transistor T1 and having its gate made receptive of the input signal SI; and a diode D1 connected in parallel with the MOSFET Q1. The MOSFET Q1 and diode D1 act not only as variable impedance means for the input transistor T1. The MOSFET Q1 also acts as active pull-up means for speeding up the rise of an output signal SO. The diode D1 acts as level setting means for setting the low level of the output signal SO. As a result, the SPL circuit has its power consumption reduced while having its operations speeded up and stabilized.

SUMMARY OF THE INVENTION

However, we have tried to further reduce the power consumption of the aforementioned SPL circuit of FIG. 7 and have been confronted by the following problems. Specifically, in order to further reduce the power consumption of the aforementioned SPL circuit, it is necessary to increase the resistance of the resistor R4 composing the phase division circuit thereby to decrease the operating current. However, the resistor R1 constitutes a discharge circuit of the capacitor C1 composing the differentiation circuit, when the input signal SI drops to the low level to turn off the input transistor T1. If the resistance of the resistor R1 is increased, the discharge time of the capacitor C1 is elongated. Especially in case it is a short period that the input signal SI is a negative pulse at the low level, as exemplified in FIG. 8, the effect of the differentiation circuit is deteriorated to delay the breaking of the output signal SO. As a result, the SPL circuit has its impulse and step responsiveness deteriorated and its low power consumption restricted.

An object of the present invention is to provide an SPL circuit which is intended to reduce the power consumption while enhancing the impulse responsiveness and the step responsiveness.

The aforementioned and other objects and novel features of the present invention will become apparent from the following description to be made with reference to the accompanying drawings.

A representative embodiment of the present invention to be disclosed hereinafter will be summarized in the following discussion. Between the collector of an input transistor constituting a phase division circuit (a phase splitter circuit) of the SPL (i.e., Super Push-pull Logic) circuit and a first supply voltage, there is connected first variable impedance means which is composed of a P-channel MOSFET having its gate made receptive of an input signal and a diode connected in parallel with the MOSFET. Between the emitter of the input transistor and a second supply voltage, there is connected second variable impedance means which is composed of an N-channel MOSFET having its gate made receptive of either the output signal of the circuit or its differentiated signal.

According to the aforementioned means, the N-channel MOSFET composing the second variable impedance means is selectively turned on in accordance with the input signal so that the operating current of the phase division circuit can be reduced while shortening the discharge time of the capacitor of the differentiation circuit for transmitting the change of the input signal to the pull-down transistor. As a result, the SPL circuit can have its low power consumption promoted while enhancing its impulse responsiveness and step responsiveness.

DESCRIPTION OF THE PREFERRED EMBODIMENTS

Figure 1:
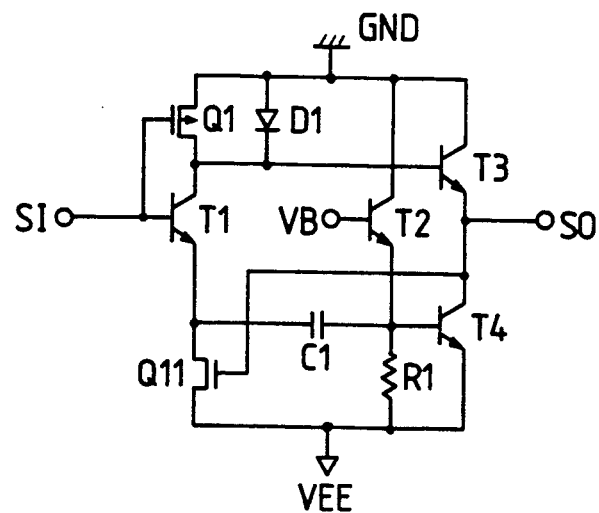
FIG. 1 is a circuit diagram showing an embodiment of the SPL circuit according to the present invention.
Figure 2:
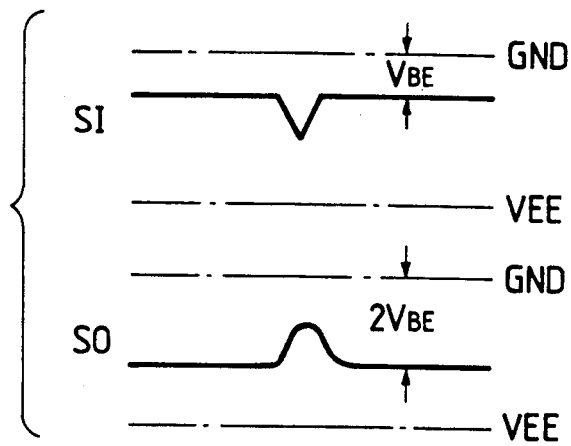
FIG. 2 is a waveform chart showing one example of the signals of the SPL circuit of FIG. 1.

FIG. 1 is a circuit diagram showing an embodiment of the SPL (i.e., Super Push-Pull Logic) circuit according to the present invention. On the other hand, FIG. 2 is a waveform chart showing one example of the signals of the SPL circuit of FIG. 1. With reference to these Figures, the structure of the SPL circuit of this embodiment will be described in the following together with the summary of operations and the features.

Incidentally, a number of SPL circuits according to this embodiment are combined to construct a high speed logic integrated circuit device for constituting a high speed computer. The individual circuit elements of FIG. 1 are formed, together with others constituting the high speed logic integrated circuit device, over a single semiconductor substrate made of a single crystal of silicon, although not especially limited thereto. In the following circuit diagrams, the MOSFET (i.e., Metal Oxide Semiconductor Field Effect Transistor, which is intended to be a general term to cover all the insulated gate field effect transistors) having its channel (or back gate) indicated by an arrow is of P-channel type. This is discriminated from an N-channel MOSFET which is shown as having no arrow. Moreover, all the shown transistors (as merely abbreviated from bipolar transistors) belong to the NPN type, although not especially limited thereto.

In FIG. 1, the SPL circuit of this embodiment includes an input transistor (a phase splitter transistor) T1 having its base made receptive of a predetermined input signal SI, although not especially limited thereto. This input transistor T1 has its collector coupled to the ground potential GND (or the first supply voltage) of the circuit through a P-channel MOSFET Q1 and a diode D1 in parallel with each other, and its emitter coupled to a supply voltage VEE (or the second supply voltage) through an N-channel MOSFET Q11 (or the first N-channel MOSFET), although not especially limited thereto. The input transistor T1, the MOSFET Q1, the diode D1 and the MOSFET Q11 constitute the phase division circuit (the phase splitter circuit) of the SPL circuit.

The MOSFET Q1 has its gate fed with the input signal SI, and the MOSFET Q11 has its gate fed with the output signal SO of the circuit. Here, the ground potential GND is at 0 V and the supply voltage VEE is set at a negative level such as −2.2 V, although not especially limited thereto. On the other hand, the input signal SI is a digital signal having a relatively small amplitude set to a high level of −0.8 V and a low level of −1.4 V. Moreover, the diode D1 is made on the basis of the NPN bipolar transistor and has a forward voltage nearly equal to the base-emitter voltage $V_{BE}$ of the transistor.

Thus, the MOSFET Q1 acts as the so-called "active pull-up means" for abruptly charging the parasitic capacity to be coupled to the collector node of the input transistor T1 to speed up the rise of the output signal SO of the circuit, when the input signal SI is set to the low level to turn off the input transistor T1. On the other hand, the diode D1 acts as the so-called "level setting means" for setting the low level of the output signal SO to about $-2V_{BE}$ when the input signal SI is set to the high level to turn off the MOSFET Q1. In short, the MOSFET Q1 and the diode D1 act as first variable impedance means for the input transistor T1 thereby to restrict the steady operating current of the SPL circuit while setting the level of the output signal SO.

On the other hand, the MOSFET Q11 acts as the so-called "second variable impedance means" for the input transistor T1. Q11 is selectively turned on to shorten the discharge time of the later-described capacitor C1, when the input signal S1 is set to the low level whereas the output signal SO is set to the high level.

The SPL circuit of this embodiment further includes an output transistor T3 and a pull-down transistor T4 (or the pull-down means) which are connected in the mode of a totem pole between the ground potential and the supply voltage VEE of the circuit, although not especially limited thereto. Of these, the output transistor T3 has its base connected with the inverted output node of the aforementioned phase division circuit, i.e., the collector of the input transistor T1, and the transistor T4 has its base connected with the non-inverted node of the phase division circuit, i.e., the emitter of the input transistors T1 via a capacitor C1 (i.e., a first capacitor). Between the base of the transistor T4 and the supply voltage VEE, there is connected a resistor R1 (or first resistor means) which constitutes a first differentiation circuit together with the capacitor C1. Moreover, the commonly connected emitters and collectors of the transistors T3 and T4 are connected with the output terminal SO of the SPL circuit. As a result, the transistors T3 and T4 constitute the so-called "push-pull output circuit", and the transistor T4, the capacitor C1 and the resistor R1 constitute the active pull-down circuit for the output transistor T3.

Between the ground potential of the circuit and the base of the transistor T4, there is connected a bias transistor T2, although not especially limited thereto. This transistor T2 has its base fed with a predetermined bias voltage VB higher by 2 $V_{BE}$ than the supply voltage VEE from the not-shown voltage generator of the high speed logic integrated circuit device, although not especially limited thereto. Thus, the transistor T4 is fed with a bias voltage higher by $V_{BE}$ than the supply voltage of the circuit. As a result, the output transistor T4 is biased to the state immediately before it is turned on.

In the phase division circuit, the input transistor T1 is turned on, but the MOSFET Q1 is substantially turned off, when the input signal SI is raised to a high level such as $-V_{BE}$. As a result, the inverted output signal of the phase division circuit, i.e., the collector potential of the input transistor T1, is set to such a low level, e.g., $-V_{BE}$ as is lower by the forward voltage of the diode D1 than the ground potential of the circuit, but the non-inverted output voltage, i.e., the emitter potential of the input transistor T1, is set to such a high level, e.g., $-2V_{BE}$ as is lower by the base-emitter voltage of the input transistor T1 than the aforementioned high level of the input signal SI.

The low level of the inverted output signal of the phase division circuit is transmitted as it is to the base of the output transistor T3, and the rise of the non-inverted output signal is transmitted to the base of the pull-down transistor T4 through the first differentiation circuit which is composed of the capacitor C1 and the resistor R1. Thus, the output transistor T3 is turned off, and the pull-down transistor T4 is turned on for a while. As a result, the output signal SO of the SPL circuit is going to abruptly drop to a low level such as the supply voltage of the circuit. Between the ground potential of the circuit and the collector of the input transistor T1, however, a clamp circuit is connected which is composed of the diode D1, as has been described hereinbefore. Thus, the low level of the output signal SO of the SPL circuit is clamped at a level of about $-2V_{BE}$.

At this time, the MOSFET Q11 is substantially turned off because the output signal SO is set to the low level. Thus, the operating current to be fed to the phase division circuit is so minute as to reduce the power consumption of the SPL circuit.

In the phase division circuit, on other hand, the input transistor T1 is turned off, but the MOSFET Q is turned on, if the input signal SI is set to a low level such as $-2V_{BE}$. Thus, the inverted output signal of the phase division circuit is set to a high level such as the ground potential of the circuit, so that the non-inverted output signal is set to such a low level, e.g., $-3V_{BE}$ as is lower by the base-emitter voltage of the input transistor T1 than the aforementioned lower level of the input signal SI. The high level of the inverted output signal of the phase division circuit is likewise transmitted as it is to the base of the output transistor T3, and the breaking change of the non-inverted output signal is transmitted through the aforementioned differentiation circuit to the base of the pull-down transistor T4. Thus, the pull-down transistor T4 is turned off, but the output transistor T3 is turned on. As a result, the output signal SO of the SPL circuit is set to a high level of about $-V_{BE}$. In short, the SPL circuit of FIG. 1 functions as an inverter circuit for inverting and transmitting the logical level of the input signal SI to the output terminal SO.

When the input signal SI is set to the low level to turn off the input transistor T1, the MOSFET Q11 constituting the second variable impedance means is turned on because the output signal SO of the SPL circuit is set to a high level such as $-V_{BE}$. At this time, the stored charges of the capacitor C1 constituting the first differentiation circuit are abruptly released through that MOSFET Q11 so that the discharge time is drastically shortened. Thus, the operation as a differentiation circuit is not deteriorated so that the output signal SO obtainable has a corresponding small pulse width, even in case the input signal SI is a negative pulse having a relatively small pulse width, as exemplified in FIG. 2. As a result, the SPL circuit can have its impulse responsiveness and step responsiveness enhanced while having its power consumption reduced.

In the SPL circuit of this embodiment, as has been described hereinbefore, there is connected at the collector side of the input transistor T1 constituting the phase division circuit the first variable impedance means which is composed of: the P-channel MOSFET Q1 having its gate made receptive of the input signal SI: and the diode D1 connected in parallel with that MOSFET Q1. At the emitter side, there is connected the second variable impedance means which is composed of the N-channel MOSFET Q11 having its gate made receptive of the output signal SO of the circuit. The MOSFET Q1 acts as the pull-up means which is selectively turned on, when the input signal SI is set to the low level, to speed up the rising change of the output signal SO. At this time, the MOSFET Q11 is selectively turned on, when the output signal SO is set to the high level, to release the stored charges of the capacitor C1 of the differentiation circuit abruptly. When the input signal SI is set to the high level whereas the output signal SO is set to the low level, both the MOSFETs Q1 and Q11 are substantially turned off so that the operating current of the phase division circuit is limited to a minute value. As a result, the SPL circuit can have its impulse responsiveness and step responsiveness enhanced while having its power consumption reduced.

Figure 3:
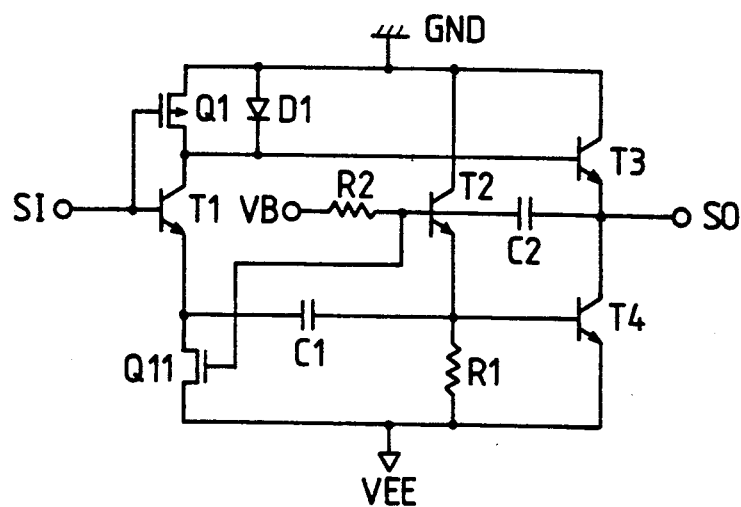
FIG. 3 is a circuit diagram showing another embodiment of the SPL circuit according to the present invention.

FIG. 3 is a circuit diagram showing another embodiment of the SPL circuit according to the present invention. Incidentally, the following embodiments accompany the aforementioned one of FIG. 1 basically, and the description is added only to the different portions.

In FIG. 3, the SPL circuit includes: a capacitor C2 (or a second capacitor) connected between the output terminal SO of the circuit and the base of the bias transistor T2; and a resistor R2 (or second resistor means) connected between the supply point of the constant voltage VB and the base of the aforementioned transistor T2. This transistor T2 has its base connected with the gate of the MOSFET Q11 which constitutes the second variable impedance means.

The capacitor C2 constitutes a feedback circuit for transmitting the level change of the output signal SO through the transistor T2 to the base of the pull-down transistor T4 to enhance the pull-down effect of the transistor T4. On the other hand, the resistor R2 has operations: to suppress the bias voltage VB from fluctuating, due to the change in the base current of the bias transistor T2, when the transistor T4 is selectively turned on; and to constitute the second differentiation circuit together with the aforementioned capacitor C2 to turn on the MOSFET Q11 for a while. As a result, the SPL circuit can have its impulse responsiveness and step responsiveness further enhanced, and the phase division circuit can have its operating current further reduced, so that the SPL circuit can have its low power consumption promoted.

Figure 4:
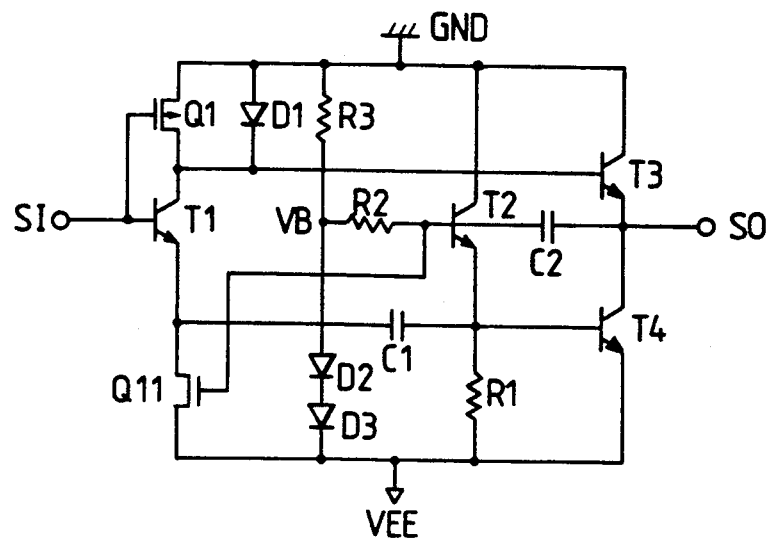
FIG. 4 is a circuit diagram showing still another embodiment of the SPL circuit according to the present invention.

FIG. 4 is a circuit diagram showing still another embodiment of the SPL circuit according to the present invention.

In FIG. 4, the SPL circuit of this embodiment includes a resistor R3 and diodes D2 and D3, which are connected in series between the ground potential of the circuit and the supply voltage VEE. Here, the resistor R3 is designed to have a relatively high resistance. On the other hand, the diodes D2 and D3 are constructed on the basis of the NPN transistor and have forward voltages corresponding to the base-emitter voltage $V_{BE}$ of the transistor. The diode D2 has its anode potential set to the aforementioned bias voltage VB, and this is coupled through the resistor R2 to the base of the bias transistor T2.

From these, the resistor R3 and the diodes D2 and D3 act as the constant voltage generation circuit to generate a bias voltage VB higher by 2 $V_{BE}$ than the supply voltage VEE and to feed it to the corresponding bias transistor T2. In short, the SPL circuit of this embodiment is equipped with a constant voltage generation circuit for generating the bias voltage VB so that the level fluctuation of the bias voltage VB by the parasitic resistance of the supply wiring line is further suppressed. Incidentally, the operating current to be fed to the constant voltage generation circuit is reduced by the high resistance of the resistor R3 so that the SPL circuit can have its power consumption reduced.

Figure 5:
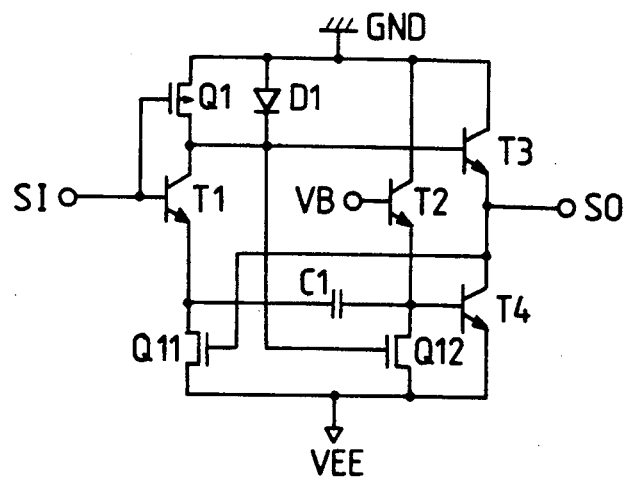
FIG. 5 is a circuit diagram showing a further embodiment of the SPL circuit according to the present invention.

FIG. 5 is a circuit diagram showing a further embodiment of the SPL circuit according to the present invention.

In FIG. 5, the resistor R1, or the first resistor means, which constitutes the bias circuit together with the bias transistor T2 and the first differentiation circuit together with the capacitor C1, is replaced by an N-channel MOSFET Q12 (or a second N-channel MOSFET) having its gate made receptive of the collector potential of the input transistor T1.

The MOSFET Q12 is selectively turned on, when the collector potential of the input transistor T1 is set to the high level, that is, when the input signal SI is set to the low level whereas the output signal SO is set to the high level, to feed the pull-down transistor T4 with a predetermined bias voltage immediately before the transistor T4 is turned on. When the input signal SI is set to the high level whereas the collector potential of the input transistor T1 is set to the low level, the MOSFET Q12 has its conductance reduced. As a result, the bias circuit has its operating current reduced so that the SPL circuit can have its power consumption further reduced. In case of this embodiment, the resistor R1 is replaced by the MOSFET Q12 so that the circuit has no resistor. As a result, the SPL circuit can have its fabrication process simplified to drop its production cost.

Figure 6:
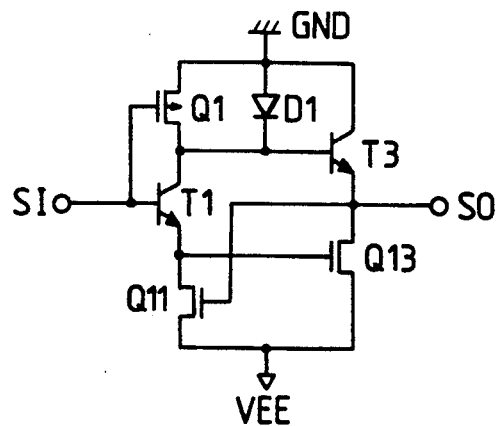
FIG. 6 is a circuit diagram showing a further embodiment of the SPL circuit according to the present invention.
Figure 7:
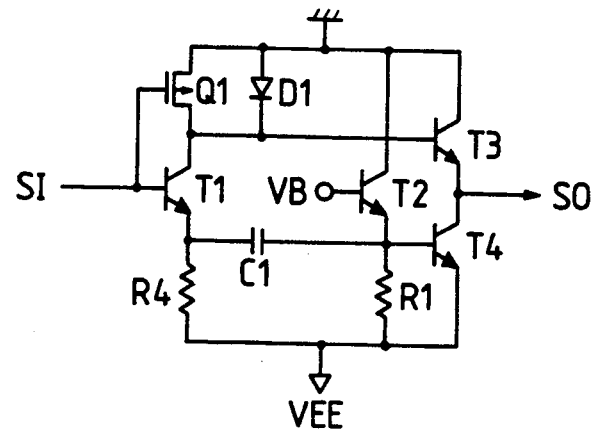
FIG. 7 is a circuit diagram showing the SPL circuit which was developed by us prior to the present invention.
Figure 8:
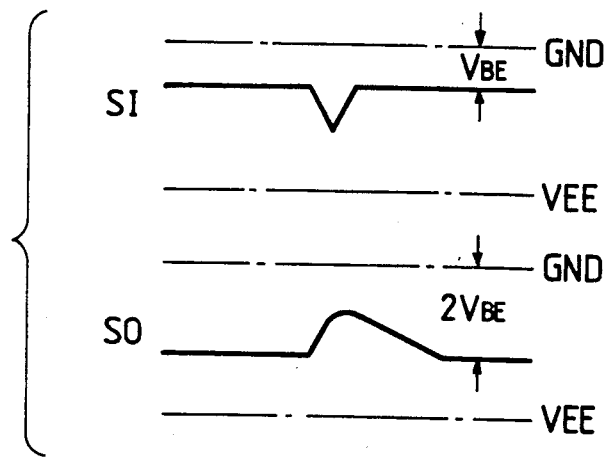
FIG. 8 is a waveform chart showing one example of the signals of the SPL circuit of FIG. 7.
Figure 9:
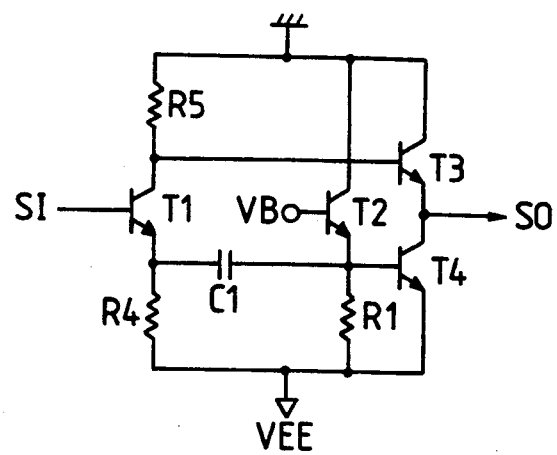
FIG. 9 is a basic circuit diagram showing one example of the SPL circuit which was developed by us.

FIG. 6 is a circuit diagram showing a further embodiment of the SPL circuit according to the present invention.

In FIG. 6, the pull-down means to be connected between the emitter of the output transistor T3, i.e., the output terminal SO of the circuit and the supply voltage VEE (or the second supply voltage) is replaced by an N-channel MOSFET Q13 (or the third N-channel MOSFET Q) which has its gate made receptive of the emitter potential of the input transistor T1.

The MOSFET Q13 is selectively turned on to abruptly discharge the load capacity to be connected with the output terminal SO of the circuit, when the input signal SI is set to the high level whereas the emitter potential of the input transistor T1, i.e., the non-inverted output signal of the phase division circuit is set to the high level. When the input signal SI is set to the low level and when the emitter potential of the input transistor T1 is set to the low level, the MOSFET Q13 is substantially turned off. With the effects similar to those of the aforementioned embodiment of FIG. 1 being retained, therefore, the SPL circuit can have its circuit structure and its fabrication process simplified while having its layout area reduced.

As has been described hereinbefore in connection with the embodiments, the following operational effects can be attained if the present invention is applied to the SPL circuit to be packaged in the high speed logic integrated circuit device constituting the high speed computer.

(1) Between the collector of the input transistor constituting the phase division circuit of the SPL (i.e., Super Push-pull Logic) circuit and the first supply voltage, there is connected first variable impedance means which is composed of the P-channel MOSFET having its gate made receptive of the input signal and the diode connected in parallel with the MOSFET. Between the emitter of the input transistor and the second supply voltage, there is connected second variable impedance means which is composed of the N-channel MOSFET having its gate made receptive of either the output signal of the circuit or its differentiated signal. As a result, there can be attained an effect that the N-channel MOSFET can be selectively turned on in response to the input signal to reduce the operating current of the phase division circuit while shortening the discharge time of the capacitor of the differentiation circuit for transmitting the change in the input signal to the pull-down transistor.

(2) Thanks to the aforementioned item (1), there can be attained an effect that the SPL circuit can have its low power consumption promoted while having its impulse responsiveness and step responsiveness enhanced.

(3) In the aforementioned items (1) and (2), between the output terminal of the circuit and the gate of the N-channel MOSFET constituting the second variable impedance means, there is connected the second differentiation circuit which is composed of a capacitor and a resistor. As a result, there can be attained an effect that the SPL circuit can have its low power consumption promoted by turning off the N-channel MOSFET for a while.

(4) In the aforementioned items (1) to (3), the resistor, which constitutes the bias circuit for the pull-down transistor together with the bias transistor, and which constitutes together with the capacitor the differentiation circuit for transmitting the level change of the non-inverted output signal of the phase division circuit to the base of the pull-down transistor, is replaced by the N-channel MOSFET which has its gate made receptive of the collector potential of the input transistor, i.e., the inverted output signal of the phase division circuit. As a result, there can be attained effects that the SPL circuit can have its fabrication process simplified to promote its low production cost, and that the operating current of the bias circuit can be reduced to further promote the low power consumption of the SPL circuit.

(5) In the aforementioned items (1) and (2), the pull-down transistor is replaced by the N-channel MOSFET which has its gate made receptive of the emitter potential of the input transistor, i.e., the non-inverted output signal of the phase division circuit. As a result, there can be attained an effect that the SPL circuit can have its circuit structure and fabrication process simplified, while having its impulse responsiveness and step responsiveness enhanced and its power consumption reduced, to have its layout area reduced.

Figure 10:
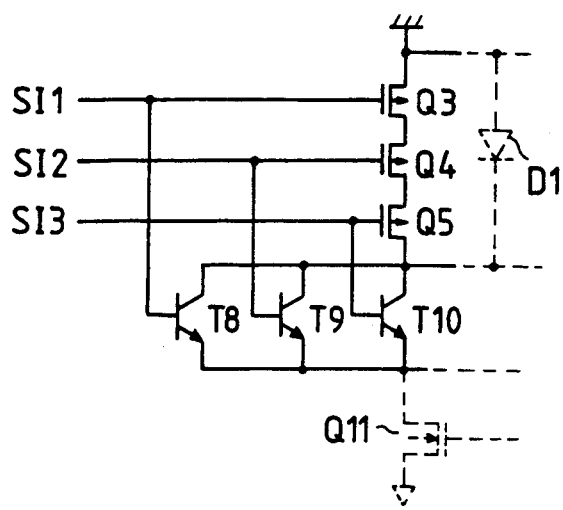
FIGS. 10 to 13 are circuit diagrams showing modifications which can be applied to the SPL circuits of FIG. 1 and FIGS. 3 to 6.
Figure 11:
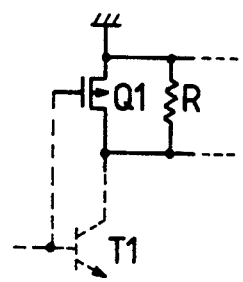
Figure 12:
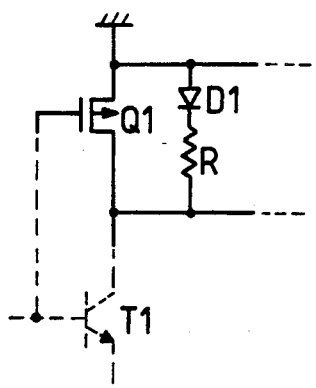
Figure 13:
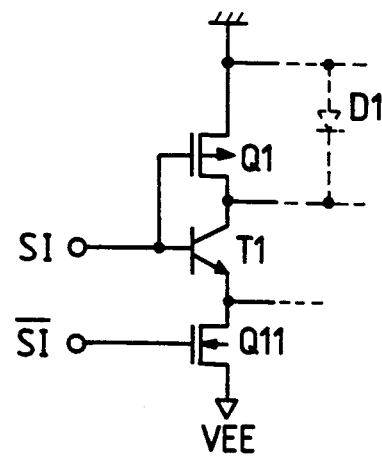

Although our invention has been specifically described in connection with the embodiments thereof, it should not be limited thereto but can naturally be modified in various manners without departing from the gist thereof. In the embodiments of FIG. 1 and FIGS. 3 to 6, for example, the SPL circuit can be given an arbitrary number of inputs or logic functions by changing the number or connection of the input transistors constituting the phase division circuit, as shown in FIG. 10. The diode D1 constituting the first variable impedance means can be replaced by a resistor R only, as shown in FIG. 11, or by a series circuit of a diode D1 and a resistor R, as shown in FIG. 12. In case, moreover, an inverted signal $\overline{SI}$ of the input signal SI is present, it may be fed to the gate of the N-channel MOSFET Q11 which constitutes the second variable impedance, as shown in FIG. 13. Still moreover, a variety of modes of embodiment can be adopted by the specific circuit structure of the SPL circuit, the polarity and absolute value of the supply voltage, the conductivity type of the MOSFETs and transistors of the individual embodiments.

In the description thus far made, our invention has been described mainly in case it is applied to the SPL circuit to be packaged in the high speed logic integrated circuit device providing the field of application of the background thereof, but should not be limited thereto. For example, the present invention can be applied to an SPL circuit or similar logic circuit to be packaged in a gate array integrated circuit or a variety of special logic integrated circuit device. The present invention can be widely applied to a logic circuit which is equipped with a phase division circuit including at least an input transistor and an emitter load.

The effects to be attained by the representative embodiments of the invention disclosed herein will be briefly described in the following. Between the collector of the input transistor constituting the phase division circuit of the SPL (i.e., Super Push-pull Logic) circuit and the first supply voltage, there is connected first variable impedance means which is composed of the P-channel MOSFET having its gate made receptive of the input signal and the diode connected in parallel with the MOSFET. Between the emitter of the input transistor and the second supply voltage, there is connected second variable impedance means which is composed of the N-channel MOSFET having its gate made receptive of either the output signal of the circuit or its differentiated signal. Thus, the N-channel MOSFET can be selectively turned on in response to the input signal to reduce the operating current of the phase division circuit while shortening the discharge time of the capacitor of the differentiation circuit for transmitting the change in the input signal to the pull-down transistor. As a result, the SPL circuit can have its low power consumption promoted while having its impulse responsiveness and step responsiveness enhanced.

What is claimed is:

1. A logic circuit comprising:
   first and second terminals for receiving first and second supply voltages, respectively;
   a first input terminal for receiving an input signal;
   an output terminal;
   a first input bipolar transistor having a base coupled to receive the input signal, a collector and an emitter;
   first variable impedance means coupled between the first terminal and the collector of the first input bipolar transistor and responsive to the input signal and for changing its impedance;
   second variable impedance means coupled between the emitter of the first input bipolar transistor and the second terminal and for changing its impedance in response to an output signal on the output terminal;
   an output bipolar transistor having a base coupled to the collector of the first input bipolar transistor and an emitter-collector path coupled between the first terminal and the output terminal; and
   pull-down means coupled between the output terminal and the second terminal and responsive to an emitter signal on the emitter of the first input bipolar transistor and for pulling down a voltage on the output terminal.

2. A logic circuit according to claim 1, wherein the first variable impedance means includes:
   a first P-channel MOSFET having a source-drain path coupled between the first terminal and the collector of the first input bipolar transistor and a gate coupled to the first input terminal, and
   a diode coupled between the first terminal and the collector of the first input bipolar transistor.

3. A logic circuit according to claim 2, wherein the first variable impedance means further includes a resistor coupled between the diode and the collector of the first input bipolar transistor.

4. A logic circuit according to claim 1, wherein the second variable impedance means includes an N-channel MOSFET having a source-drain path coupled between the emitter of the first input bipolar transistor and the second terminal and a gate coupled to the output terminal.

5. A logic circuit according to claim 2, wherein the pull-down means includes a pull-down bipolar transistor having a collector-emitter path coupled between the output terminal and the second terminal and a base, and wherein the logic circuit further comprises a capacitor coupled between the emitter of the first input bipolar transistor and the base of the pull-down bipolar transistor.

6. A logic circuit according to claim 5, further comprising:
   resistor means coupled between the base of the pull-down transistor and the second terminal; and
   a bias transistor having a collector-emitter path coupled between the first terminal and the base of the pull-down transistor and a base coupled to receive a predetermined voltage.

7. A logic circuit according to claim 6, wherein the resistor means includes an MOSFET having a source-drain path coupled between the base of the pull-down transistor and the second terminal and a gate coupled to the collector of the first input bipolar transistor.

8. A logic circuit according to claim 2, wherein the pull-down means includes a pull-down MOSFET having a source-drain path coupled between the output terminal and the second terminal and a gate coupled to the emitter of the first input bipolar transistor.

9. A logic circuit according to claim 2, further comprising:
   a second input terminal;
   a second input bipolar transistor having a collector-emitter path coupled to the collector-emitter path of the first input bipolar transistor in parallel and a base coupled to the second input terminal; and
   a second P-channel MOSFET having a gate coupled to the second input terminal (S2) and a source-drain path coupled in series to the source-drain path of the first P-channel MOSFET.

10. A logic circuit according to claim 2, wherein the first input bipolar transistor and the output bipolar transistor are of an NPN type.

11. A logic circuit according to claim 10, wherein the logic circuit is formed on a semiconductor substrate.

12. A logic circuit comprising:
first and second terminals for receiving first and second supply voltages, respectively;
a first input terminal for receiving an input signal;
an output terminal;
a first input bipolar transistor having a base coupled to receive the input signal, a collector and an emitter;
a differentiation circuit coupled to the output terminal;
first variable impedance means coupled between the first terminal and the collector of the first input bipolar transistor and responsive to the input signal and for changing its impedance;
second variable impedance means coupled between the emitter of the first input bipolar transistor and the second terminal and for changing its impedance in response to an output signal of the differentiation circuit;
an output bipolar transistor having a base coupled to the collector of the first input bipolar transistor and an emitter-collector path coupled between the first terminal and the output terminal; and
pull-down means coupled between the output terminal and the second terminal and responsive to an emitter signal on the emitter of the first input bipolar transistor and for pulling down a voltage on the output terminal.

13. A logic circuit according to claim 12, wherein the first variable impedance means includes:
a first P-channel MOSFET having a source-drain path coupled between the first terminal and the collector of the first input bipolar transistor and a gate coupled to the first input terminal, and
a diode coupled between the first terminal and the collector of the first input bipolar transistor.

14. A logic circuit according to claim 13, wherein the first variable impedance means further includes a resistor coupled between the diode and the collector of the first input bipolar transistor.

15. A logic circuit according to claim 12, wherein the second variable impedance means includes an N-channel MOSFET having a source-drain path coupled between the emitter of the first input bipolar transistor and the second terminal and a gate coupled to receive the output signal of the differentiation circuit.

16. A logic circuit according to claim 13, wherein the pull-down means includes a pull-down bipolar transistor having a collector-emitter path coupled between the output terminal and the second terminal and a base, and wherein the logic circuit further comprises a capacitor coupled between the emitter of the first input bipolar transistor and the base of the pull-down bipolar transistor.

17. A logic circuit according to claim 16, further comprising:
resistor means coupled between the base of the pull-down transistor and the second terminal; and
a bias transistor having a collector-emitter path coupled between the first terminal and the base of the pull-down transistor and a base coupled to receive a predetermined voltage.

18. A logic circuit according to claim 13, further comprising:
a second input terminal;
a second input bipolar transistor having a collector-emitter path coupled in parallel to the collector-emitter path of the first input bipolar transistor and a base coupled to the second input terminal; and
a second P-channel MOSFET having a gate coupled to the second input terminal and a source-drain path coupled in series to the source-drain path of the first P-channel MOSFET.

19. A logic circuit according to claim 13, wherein the first input bipolar transistor and the output bipolar transistor are of an NPN type.

20. A logic circuit according to claim 19, wherein the logic circuit is formed on a semiconductor substrate.

21. A logic circuit according to claim 12, wherein the differentiation circuit is coupled between the output terminal and a third terminal to which a predetermined voltage is supplied, wherein the differentiation circuit comprises a resistor and a capacitor coupled in series between the output terminal and the third terminal, and wherein the output signal of the differentiation circuit is provided from a common connection point of the resistor and the capacitor.

22. A logic circuit comprising:
first and second terminals for receiving first and second supply voltages, respectively;
a first input terminal for receiving a first input signal;
a second input terminal for receiving a second input signal reversed relative to the first input signal;
an output terminal;
a first input bipolar transistor having a base coupled to receive the input signal, a collector and an emitter;
first variable impedance means coupled between the first terminal and the collector of the first input bipolar transistor and responsive to the first input signal and for changing its impedance
second variable impedance means coupled between the emitter of the first input bipolar transistor and the second terminal and for changing its impedance in response to the second input signal;
an output bipolar transistor having a base coupled to the collector of the first input bipolar transistor and an emitter-collector path coupled between the first terminal and the output terminal; and
pull-down means coupled between the output terminal and the second terminal and responsive to an emitter signal on the emitter of the first input bipolar transistor and for pulling down a voltage on the output terminal.

23. A logic circuit according to claim 22, wherein the first variable impedance means includes:
a first P-channel MOSFET having a source-drain path coupled between the first terminal and the collector of the first input bipolar transistor and a gate coupled to the first input terminal, and
a diode coupled between the first terminal and the collector of the first input bipolar transistor.

24. A logic circuit according to claim 23, wherein the first variable impedance means further includes a resistor coupled between the diode and the collector of the first input bipolar transistor.

25. A logic circuit according to claim 22, wherein the second variable impedance means includes an N-channel MOSFET having a source-drain path coupled between the emitter of the first input bipolar transistor and the second terminal and a gate coupled to the second input terminal.

26. A logic circuit according to claim 23, wherein the pull-down means includes a pull-down bipolar transistor having a collector-emitter path coupled between the output terminal and the second terminal and a base, and wherein the logic circuit further comprises a capacitor coupled between the emitter of the first input bipolar transistor and the base of the pull-down bipolar transistor.

27. A logic circuit according to claim 26, further comprising:
resistor means coupled between the base of the pull-down transistor and the second terminal; and
a bias transistor having a collector-emitter path coupled between the first terminal and the base of the pull-down transistor and a base coupled to receive a predetermined voltage.

28. A logic circuit according to claim 27, wherein the resistor means includes an MOSFET having a source-drain path coupled between the base of the pull-down transistor and the second terminal and a gate coupled to the collector of the first input bipolar transistor.

29. A logic circuit according to claim 23, wherein the pull-down means includes a pull-down MOSFET having a source-drain path coupled between the output terminal and the second terminal and a gate coupled to the emitter of the first input bipolar transistor.

30. A logic circuit according to claim 23, further comprising:
a second input terminal;
a second input bipolar transistor having a collector-emitter path coupled to the collector-emitter path of the first input bipolar transistor in parallel and a base coupled to the second input terminal; and
a second P-channel MOSFET having a gate coupled to the second input terminal and a source-drain path coupled in series to the source-drain path of the first P-channel MOSFET.

31. A logic circuit according to claim 22, wherein the first input bipolar transistor and the output bipolar transistor are of an NPN type.

32. A logic circuit according to claim 31, wherein the logic circuit is formed on a semiconductor substrate.

* * * * *